(12) United States Patent
Tsutsui

(10) Patent No.: US 6,239,623 B1
(45) Date of Patent: *May 29, 2001

(54) DIRECT COUPLING FIELD EFFECT TRANSISTOR LOGIC (DCFL) CIRCUIT

(75) Inventor: Hiroaki Tsutsui, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/193,836

(22) Filed: Nov. 18, 1998

(30) Foreign Application Priority Data

Nov. 20, 1997 (JP) .................................................. 9-319738

(51) Int. Cl.[7] ............................................... H03K 19/094
(52) U.S. Cl. ............................ 326/119; 326/112; 326/117
(58) Field of Search .............................. 326/83, 86, 112, 326/119, 120, 116, 117

(56) References Cited

U.S. PATENT DOCUMENTS

| | | | |
|---|---|---|---|
| 4,365,172 | * 12/1982 | Prater | 326/117 |
| 4,477,735 | * 10/1984 | Gollinger et al. | 326/117 |
| 4,798,978 | * 1/1989 | Lee et al. | 326/117 |
| 5,263,001 | * 11/1993 | Youn et al. | 326/117 |

* cited by examiner

Primary Examiner—Michael Tokar
Assistant Examiner—Don Phu Le
(74) Attorney, Agent, or Firm—Sughrue, Mion, Zinn, Macpeak & Seas, PLLC

(57) ABSTRACT

In a DCFL circuit, a high-speed operation is conducted in a stable state regardless of its load capacitance. The circuit includes a buffer circuit. Added to the buffer circuit is a pull-up circuit conducting a pull-up operation for a predetermined period of time when an output potential of the circuit changes from a low level to a high level. A first EFET of the pull-up circuit includes a gate electrode connected to an output terminal of a logic stage, a drain electrode coupled with a positive power source, and a source electrode linked with a drain of a second EFET. The second EFET includes a gate electrode connected to a node linked in series to a resistor element. The resistor is coupled with an input terminal. The second EFET includes the drain electrode connected to a source electrode of the first EFET and a source electrode linked with an output terminal. Due to the operation of the pull-up circuit for a fixed period of time, the propagation delay time can be minimized without increasing the steady state current when the output potential changes from a low level to a high level.

7 Claims, 4 Drawing Sheets

DIRECT COUPLING FIELD EFFECT TRANSISTOR LOGIC (DCFL) CIRCUIT

BACKGROUND OF THE INVENTION

The present invention relates to a DCFL circuit, and in particular, to a DCFL circuit which includes an enhancement mode FET (EFET) and a depression mode FET (DFET) to operate at a high speed.

DESCRIPTION OF THE PRIOR ART

Heretofore, a DCFL circuit generally includes one DFET (D1) and one EFET (E1). An example of such a conventional DCFL circuit will be described by referring to FIGS. 1 to 4.

FIG. 1 shows a configuration example of a first example of the DCFL circuit, each includes one DFET (D1) and one EFET (E1). The EFET (E1) is arranged as a driving element and includes a gate electrode connected to an input terminal IN, a source electrode linked with a ground potential, and a drain electrode coupled with an output terminal OUT via a point at which a source electrode and a gate electrode of the DFET (D1) is connected (short-circuited) to each other. On the other hand, the DFET (D1) is adopted as a load element and includes the gate element and the source element connected to the output terminal OUT and a drain electrode coupled with a positive electrode.

FIG. 2 shows in a graph waveforms at respectively nodes of the circuit when the output potential changed from a low level (L) to a high level (H). When the input potential is at a low level (L), the EFET (E1) turns off and hence the output potential is set to a high level (H) determined by Vf of an EFET in its subsequent stage. When the input potential is at a high level (H), the EFET(E1) turns on. The output potential is set to a drain-source potential Vds which is developed when the gate is connected to the source in the DFET (D1), i.e., when a drain current ID equivalent to a drain current Idss flows through the EFET (E1).

To obtain a sufficiently low value of the low level (L), the ON current of the EFET (E1) is required to be satisfactorily larger than the drain current Idss of the DFET(D1). When the output potential changes from a high level (H) to a low level (L), the charge accumulated in the output load capacity is discharged by the ON current of the EFET (E1). In contrast thereto, when the output potential changes from the low level (L) to the high level (H), the output load capacity is charged by the drain current Idss of the DFET (D1). Therefore, when the load capacity is set to a large value, a propagation delay time tpd (↑) for the transition from the low output level (L) to the high output level (H) becomes very large when compared with a propagation delay time tpd (↓) for the transition from the high output level (H) to the low output level (L).

FIG. 3 shows a conventional example 2 including a configuration of an inverter circuit using a DCFL circuit to which a buffer circuit is added for a high-speed operation. This system includes a logic stage 21, which is similar to the inverter circuit shown in FIG. 1, and a buffer circuit 22 including one DFET (D2) and two EFETs (E2 and E3). The DFET (D2) includes a gate electrode connected to an output terminal N21 of the logic stage 21, a drain electrode linked with a positive power source, and a source electrode coupled with a drain electrode of the EFET (E2) and connected to an output terminal OUT. The EFET (E2) includes a gate electrode connected to an input terminal IN, a source electrode coupled with a ground potential, and the drain electrode linked with the source electrode of the DFET (D3) to be connected to the output terminal OUT as above. An EFET (E3) is disposed as a Schottky diode to clamp a high level (H) of a terminal N21.

FIG. 4 shows waveforms at respective nodes of the circuit when the output potential changes from a low level (L) to a high level (H). When the input potential changed from a high level to a low level, the potential of the output terminal N21 alters from a low level to a high level as in the first conventional example. However, since the terminal N21 is not associated with any heavy load, the delay time is short and the potential of the terminal N21 increases at a high speed. On the other hand, although the potential of the output terminal OUT becomes equal to that of the terminal N21 in terms of the direct current, the rising speed of the potential of the output terminal OUT is lower than that of the terminal N21 when a large load capacity is connected to the output terminal OUT. That is, a high voltage Vgs is temporarily applied to the DFET (D2) and hence the current which charges the load becomes larger than the drain current Idss. Consequently, the rising speed of potential at the output terminal OUT becomes lower than that of the conventional example 1 as indicated by a dotted line. This increases the propagation delay time tpd (↑) and hence the operation speed is decreased.

The circuit configuration described above is attended with a problem that for a large load capacity, the propagation delay tpd (↑) in the transition from the low output level to the high output level becomes quite larger than the propagation delay time tpd (↓) in the reverse transition. The operation speed, which is slightly increased in the second example, is not satisfactory for practices. In addition, when the DFET is increased in size for a higher operation speed, the drain current Idss is increased, which leads to a problem of increase in the power consumption.

SUMMARY OF THE INVENTION

It is therefore an object of the present invention to provide a DCFL circuit which operates at a high speed in a stable state regardless of the load capacity.

To achieve the object above in accordance with the present invention, there is provided a DCFL circuit including FETs. The circuit includes a buffer circuit and a pull-up circuit added to the buffer circuit for conducting a pull-up operation for a predetermined period of time when an output potential of the DCFL changes from a low level to a high level.

Additionally, the DCFL circuit includes a logic stage and a buffer circuit. The FETs include an enhancement mode FET and a depression mode FET.

In addition, the pull-up circuit includes an n-input NOR circuit. The NOR circuit including n input terminals, one enhancement mode FET, n FETs (n is an integer equal to or more than one), and n resistor elements. The enhancement mode FET includes a drain electrode connected to a positive power source, a gate electrode linked with an output terminal of the logic stage, and a source electrode coupled with drain electrodes of n FETs. The n FETs include drain electrodes connected to the source electrode of the EFET, gate electrodes each linked via a resistor element to an associated input, and source electrodes connected to the output terminal.

In this connection, the resistance value of each of the resistor elements is determined in accordance with a gate capacity of each FET of the pull-up circuit. The resistor element is an injection resistor, an epitaxial resistor, or a thin film resistor or an active element including a through FET.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
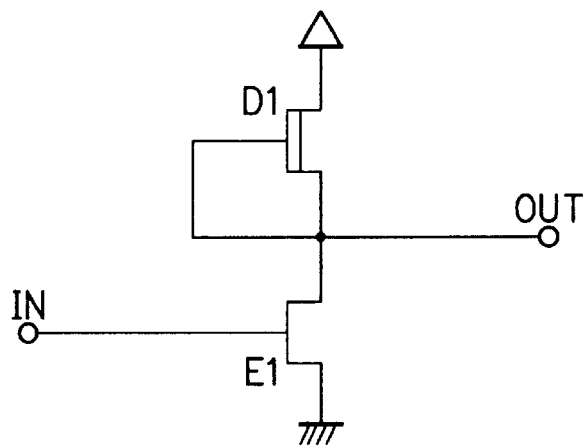
FIG. 1 is a diagram showing constitution of an inverter circuit including an ordinary DCFL circuit for explaining a conventional example 1.
Figure 2:
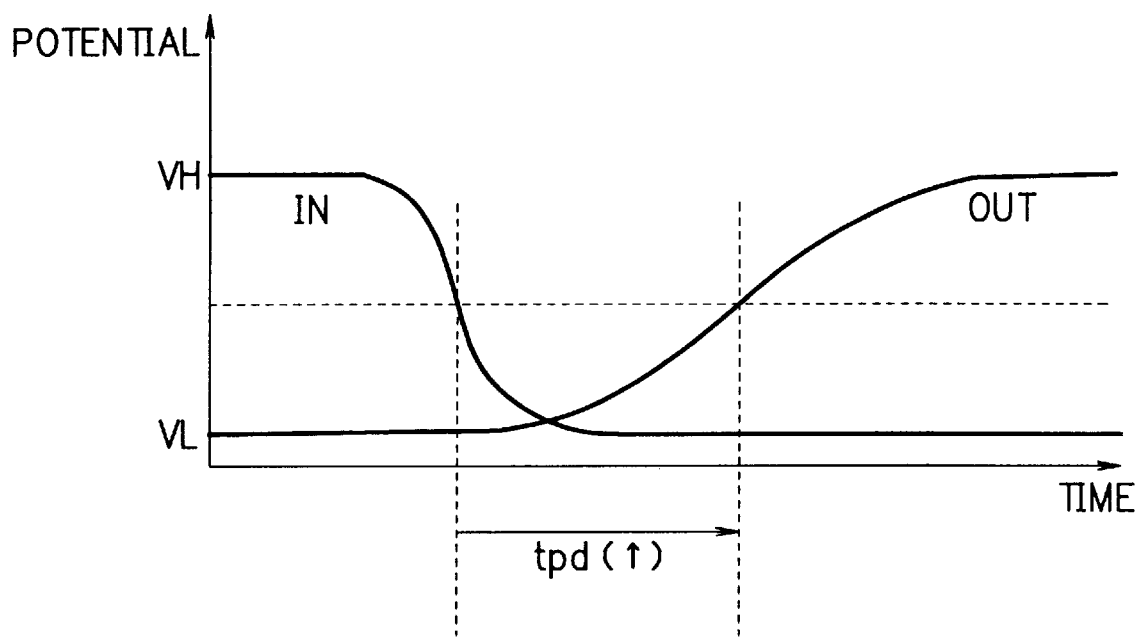
FIG. 2 is a graph showing waveforms at respective nodes of the inverter using an ordinary DCFL circuit for explaining the conventional example 1.
Figure 3:
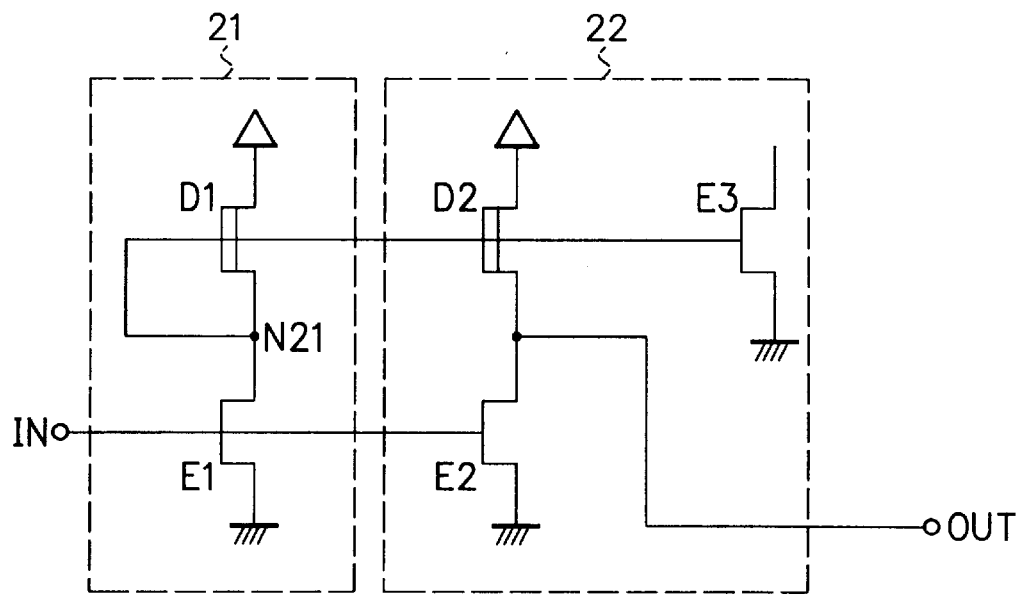
FIG. 3 is a diagram showing a configuration of an inverter circuit including a DCFL circuit with a buffer for explaining a conventional example 2.
Figure 4:
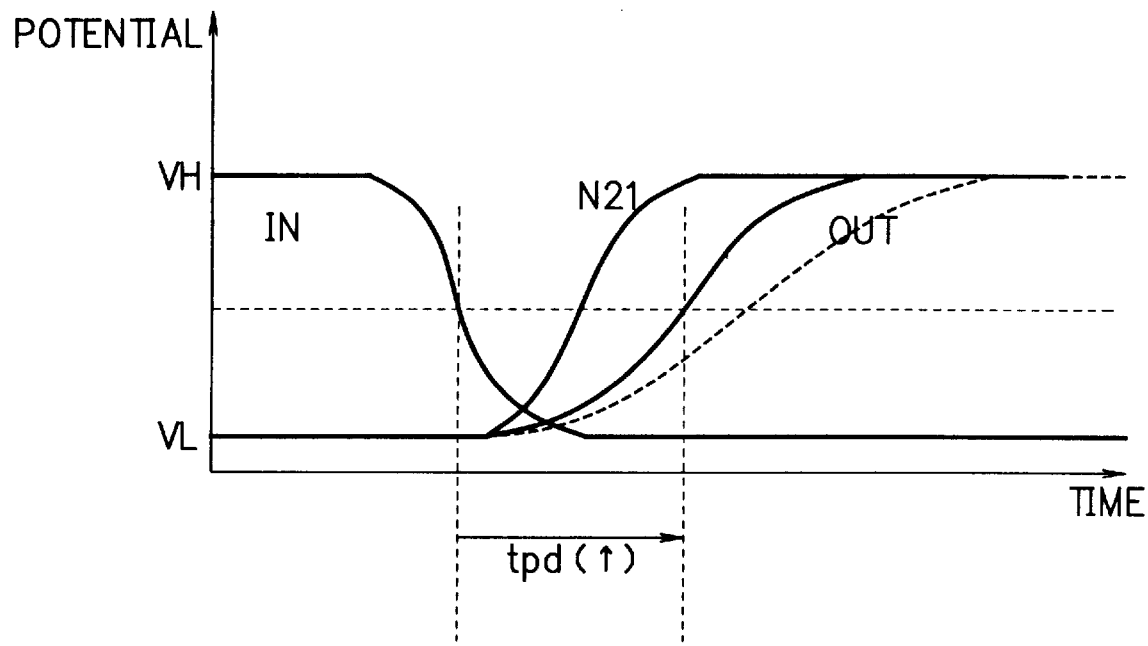
FIG. 4 is a graph showing waveforms at respective nodes of the inverter using a DCFL circuit with a buffer for explaining the conventional example 2.
Figure 5:
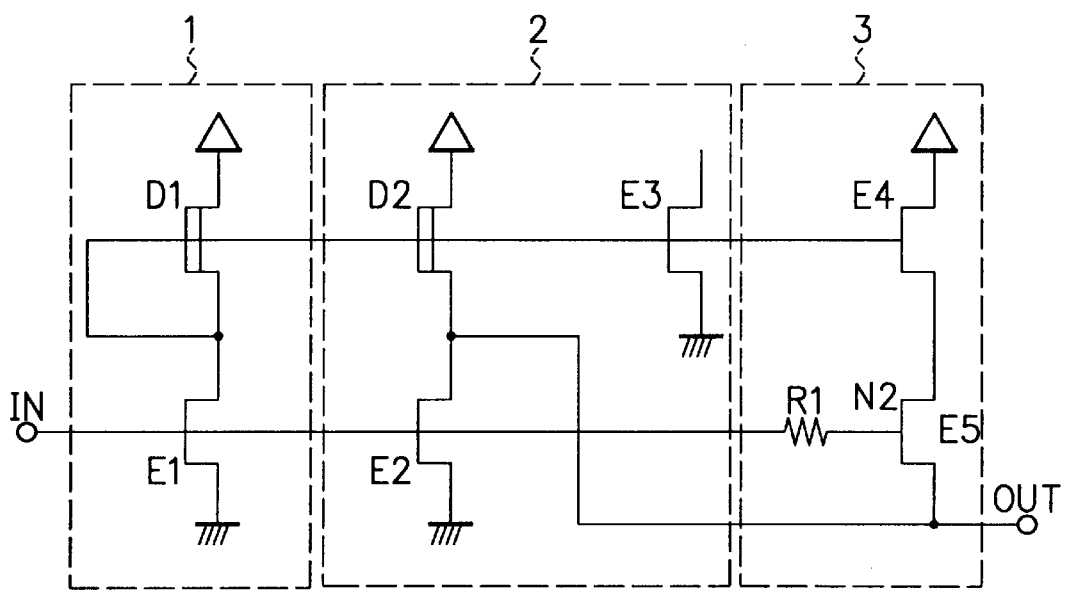
FIG. 5 is a schematic diagram showing a configuration of an inverter circuit for explaining an embodiment in accordance with the present invention.
Figure 6:
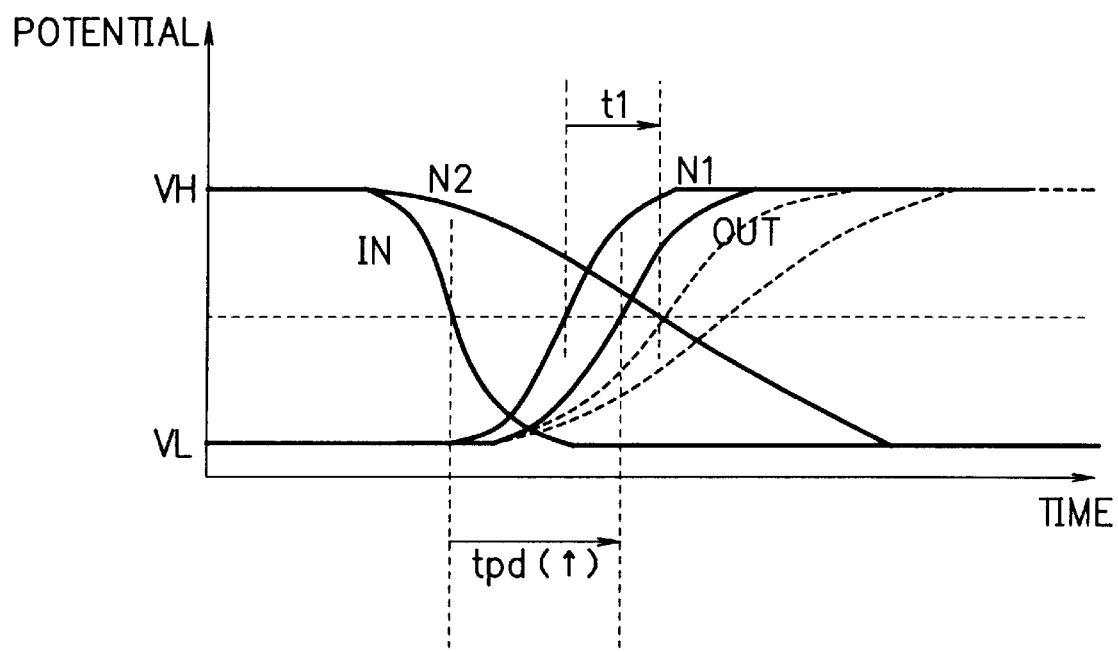
FIG. 6 is a graph showing waveforms at respective nodes of the inverter when an output potential of the inverter changes from a low level to a high level.
Figure 7:
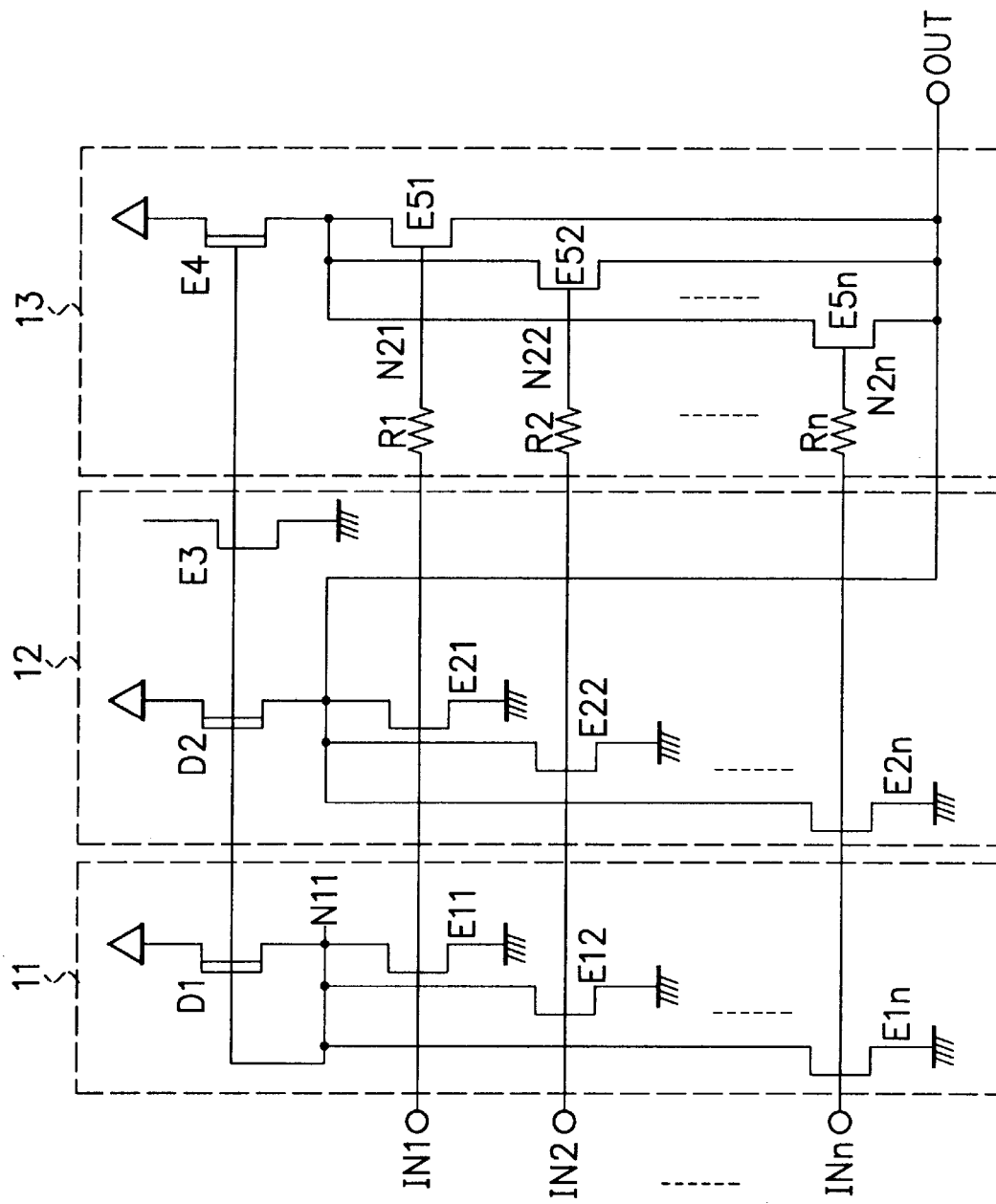
FIG. 7 is a diagram showing a circuit structure of an n-input NOR circuit for explaining an embodiment in accordance with the present invention.

Referring next to the accompanying drawings, description will be given of embodiments of the DCFL circuit in accordance with the present invention. FIGS. 5 to 7 show an embodiment of the DCFL circuit in accordance with the present invention.

FIG. 5 is a diagram for explaining the configuration of the embodiment including an inverter circuit as in a conventional example. The DCFL circuit of this embodiment includes a logic stage 1, a buffer circuit 2, and a pull-up circuit 3. Specifically, in addition to the logic stage 1 and the buffer circuit 2 which are similarly used in the conventional example 2, there is additionally provided the pull-up circuit 3 including two FETs, i.e. EFETs (E4 and E5) and a resistor element R1.

In the DCFL circuit, the logic stage 1 is an inverter circuit including an ordinary DCFL circuit which includes one DFET (D1) and one EFET (E1). The EFET (E1) used as a driving element includes a gate electrode coupled with an input terminal IN, a source electrode linked with a ground potential, and a drain electrode connected to a point at which a source electrode of the DFET (D1) is connected to a gate electrode thereof, the point being linked with a gate electrode of the EFET (E4). On the other hand, the DFET (D1) employed as a load element includes a gate electrode and a source electrode connected thereto to be linked with the gate electrode of the EFET (D4) and a drain electrode coupled with a positive electrode.

The buffer circuit 2 includes one DFET (D2) and two EFETs (E2 and E3). The DFET (D2) includes a gate electrode connected to an output terminal N1 of the logic stage 1, a drain electrode linked with a positive power source, and a source electrode connected to a drain electrode of the EFET (E2) to be coupled with an output terminal OUT. The EFET (E2) includes a gate electrode linked with the input terminal, a source electrode coupled with a ground potential, and the drain electrode connected to the source electrode of the DFET (D2) to be linked with the output terminal OUT as above. The EFET (E3) is arranged as a Schottky diode to clamp a high level (H) of the output terminal N1 and includes a gate electrode connected to the output terminal N1 and a source electrode linked with a ground potential.

The EFET (E4) of the pull-up circuit 3 includes a gate electrode connected to the output terminal N1 of the logic stage 1, a drain electrode linked with a positive power source, and a source electrode connected to a drain electrode of the EFET (E5). On the other hand, the EFET (E5) includes a gate electrode linked with a node N2 connected via a resistor element R1 to the input terminal IN, the drain electrode linked with the source electrode of the EFET (E4) as above, and a source electrode coupled with the output terminal OUT.

FIG. 6 shows waveforms of potential at respective nodes when the potential of the output terminal OUT changes from a low level to a high level. As in the conventional example 2, when the input potential (IN) alters from a high level (H) to a low level (L), the potential of the output terminal N1 of the logic stage 1 rises at a high speed. In consequence, a voltage Vgs of DFET (D2) becomes higher to increase the driving capacity thereof and a voltage Vgs of EFET (E4) also increases and the EFET (E4) turns on. On the other hand, it is possible to set the potential of the node N2 such that when the resistance value of the resistor element R1 is set to an appropriate value in accordance with the gate capacity of EFET (E5), the potential of the node N2 changes with a delay relative to the change in the input potential. In this situation, the reduction of the voltage Vgs of EFET (E5) is delayed and hence the time required for the EFET (E5) to turn off is elongated.

Resultantly, during a fixed period of time tq in which logic the output terminal N1 and the node N2 are at a high potential, the EFETs (E4 and E5) can be set to the ON state. Namely, the drain current Idss flows through the EFETs E4 and E5 only during the period t1. Consequently, the output potential is increased and the potential of the output terminal increases at a higher speed, i.e., the propagation delay time tpd (↑) is minimized and the operation speed becomes higher when compared with the conventional examples 1 and 2 (indicated by dotted lines in the graph). In other than the period t1, either the EFET (E4) or the EFET (E5) is off. Therefore, no current flows through the pull-up circuit 3 in this state and it is possible to minimize the increase in the current consumption.

Although EFETs are utilized in the pull-up circuit, there may be employed a DFET or a combination thereof only if a slight increase of the steady state current is allowed. It is to be appreciated that the resistor element may be an injection resistor, an epitaxial resistor, or a thin-film resistor or an active element such as a through FET.

FIG. 7 shows in a circuit diagram an n-input NOR circuit in accordance with the present invention.

The system includes a logic stage 11, a buffer circuit 12, and a pull-up circuit 13. The logic stage 11 and the buffer circuit 12 are similar to the conventional DCFL circuit. Namely, EFETs (E12, . . . , E1n, E22, . . . , E2n) each having a gate connected to an input are additionally arranged in parallel with an EFET (E11, E21) of an inverter circuit. The pull-up circuit 13 includes a parallel connection of FETs (E51, E52, . . . , E5n) which are disposed on the output terminal side in the pairs of FETs connected in series in the inverter circuit. Each FET includes a gate (N21, N22, . . . , N2n) connected via a resistor (R1, R2, . . . , Rn) to an associated input terminal (IN1, IN2, . . . , INn).

In the circuit, the output potential changes from a low level (L) to a high level (H) when at least one of the inputs IN1 to INn alters from a high level (H) to a low level (L) with the other inputs kept at a low level (L). Assume an input of "H to L" to be represented as INi. The associated E1$i$, E2$i$, E4$i$, R$i$, and N2$i$ conduct operation in a similar manner as the inverter above, and hence the potential of the output terminal OUT is increased at a higher speed. This results in minimization of the propagation delay time tpd (↑) and hence the operation speed is increased.

The DCFL circuit including EFETs and DFETs in accordance with the present invention includes a buffer circuit to which a pull-up circuit which operates for a fixed period of time when the output potential of the DCFL circuit changes from a low level to a high level.

The pull-up circuit in the n-input NOR circuit configuration includes one EFET, n FETs (EFETs or DFETs), and n resistor elements. The EFET includes a drain electrode connected to a positive power source, a gate electrode linked with an output terminal of a logic stage, and a source electrode coupled with drain electrodes of n FETs. The n FETs include drain electrodes connected to the source electrode of the EFET as above, gate electrodes each linked via a resistor element to an associated input, and source electrodes connected to the output terminal.

The embodiments described above are examples suitable for the present invention. Namely, the present invention is not restricted by the embodiments. These embodiments can be changed and modified within the scope of the present invention.

As above, the DCFL circuit in accordance with the present invention includes a pull-up circuit for achieving a pull-up operation for a predetermined period when the output potential changes from a low level to a high level. Thanks to the operation of the pull-up circuit for a fixed period of time, the propagation delay time tpd (↑) can be reduced without increasing the steady state current when the output potential changes from a low level to a high level.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A DCFL circuit including FETs, comprising:
   a buffer circuit;
   a pull-up circuit added to the buffer circuit for conducting a pull-up operation for a predetermined fixed period of time when an output potential of the DCFL circuit changes from a low level to a high level; and
   a logic stage connected to the buffer circuit.

2. A DCFL circuit in accordance with claim 1, wherein the FETs include an enhancement mode FET and a depression mode FET.

3. A DCFL circuit, comprising:
   a buffer circuit; and
   a pull-up circuit connected to the buffer circuit for conducting a pull-up operation for a predetermined period of time when an output potential of the DCFL changes from a low level to a high level, wherein the pull-up circuit comprises an n-input NOR circuit,
   the NOR circuit comprising:
   n input terminals;
   an enhancement mode FET (EFET);
   n FETs (n is an integer equal to or more than one); and
   n resistor elements,
   the enhancement mode FET comprising:
   a drain electrode connected to a positive power source; and
   a source electrode coupled with drain electrodes of n FETs, the n FETs including:
   drain electrodes connected to the source electrode of the EFET;
   gate electrodes each linked via a resistor element to an associated input; and
   source electrodes connected to an output terminal.

4. A DCFL circuit in accordance with claim 3, wherein a resistance value of each of the resistor elements is determined in accordance with a corresponding gate capacitance of each FET of the pull-up circuit.

5. A DCFL circuit, comprising:
   a buffer circuit;
   a logic stage connected to the buffer circuit; and
   a pull-up circuit for conducting a pull-up operation for a predetermined period of time when an output potential of the DCFL changes from a low level to a high level, wherein the pull-up circuit comprises an n-input NOR circuit,
   the NOR circuit comprising:
   n input terminals;
   an enhancement mode FET (EFET);
   n FETs (n is an integer equal to or more than one); and
   n resistor elements,
   the EFET comprising:
   a drain electrode connected to a positive power source;
   a gate electrode linked with an output terminal of the logic stage; and
   a source electrode coupled with drain electrodes of n FETs, the n FETs comprising:
   drain electrodes connected to the source electrode of the EFET;
   gate electrodes each linked via a resistor element to an associated input; and
   source electrodes connected to an output terminal of the DCFL circuit.

6. A DCFL circuit in accordance with claim 5, wherein a resistance value of each of the resistor elements is determined in accordance with a gate capacitance of each FET of the pull-up circuit.

7. A DCFL circuit in accordance with any one of claims 3, 4, 5, and 6, wherein the resistor element is an injection resistor, an epitaxial resistor, a thin film resistor, or an active element comprising a through FET.

* * * * *